US007067227B2

(12) United States Patent
Montgomery et al.

(10) Patent No.: US 7,067,227 B2
(45) Date of Patent: Jun. 27, 2006

(54) SENSITIZED CHEMICALLY AMPLIFIED PHOTORESIST FOR USE IN PHOTOMASK FABRICATION AND SEMICONDUCTOR PROCESSING

(75) Inventors: Melvin W. Montgomery, Camas, WA (US); Christopher Hamaker, Hillsboro, OR (US)

(73) Assignee: Applied Materials, Inc., Santa Clara, CA (US)

( * ) Notice: Subject to any disclaimer, the term of this patent is extended or adjusted under 35 U.S.C. 154(b) by 191 days.

(21) Appl. No.: 10/155,523

(22) Filed: May 23, 2002

(65) Prior Publication Data
US 2003/0219675 A1 Nov. 27, 2003

(51) Int. Cl.
*G03F 7/00* (2006.01)

(52) U.S. Cl. .................. 430/270.1; 430/5; 430/311; 430/319

(58) Field of Classification Search .......... 430/270.1, 430/5, 311, 319
See application file for complete search history.

(56) References Cited

U.S. PATENT DOCUMENTS

| 5,023,164 | A |   | 6/1991  | Brunsvold et al. |              |
|-----------|---|---|---------|------------------|--------------|
| 5,278,010 | A |   | 1/1994  | Day et al.       |              |
| 5,556,734 | A | * | 9/1996  | Yamachika et al. | 430/270.1    |
| 5,695,910 | A |   | 12/1997 | Urano et al.     | 340/270.1    |
| 5,707,776 | A | * | 1/1998  | Kawabe et al.    | 430/270.1    |
| 5,712,078 | A | * | 1/1998  | Huang et al.     | 430/270.1    |
| 5,731,123 | A | * | 3/1998  | Kawamura et al.  | 430/176      |
| 5,733,705 | A | * | 3/1998  | Bantu et al.     | 430/270.1    |
| 5,837,419 | A | * | 11/1998 | Ushirogouchi et al. | 430/270.1 |
| 5,852,128 | A | * | 12/1998 | Padmanaban et al. | 525/328.8   |
| 5,916,729 | A | * | 6/1999  | Kobayashi et al. | 430/270.1    |
| 5,955,222 | A | * | 9/1999  | Hibbs et al.     | 430/5        |
| 5,976,770 | A | * | 11/1999 | Sinta et al.     | 430/325      |
| 6,103,447 | A | * | 8/2000  | Chen et al.      | 430/270.1    |
| 6,210,856 | B1| * | 4/2001  | Lin et al.       | 430/270.1    |
| 6,268,436 | B1| * | 7/2001  | Chen et al.      | 525/197      |
| 6,303,263 | B1| * | 10/2001 | Chen et al.      | 430/270.1    |

FOREIGN PATENT DOCUMENTS

| EP | 0435531 | 7/1991 |
| EP | 0543762 | 5/1993 |
| EP | 0726500 | 8/1996 |
| EP | 0780732 | 6/1997 |
| EP | 0930543 | 7/1999 |

OTHER PUBLICATIONS

P. Buck et al., "Performance of the ALTA 3500 scanned-laser mask lithography system," SPIE, Apr. 1998, pp. 67-78.

(Continued)

*Primary Examiner*—Amanda Walke
(74) *Attorney, Agent, or Firm*—Duckor Spradling Metzger & Wynne

(57) ABSTRACT

The disclosure pertains to a photoresist composition and a method of using the photoresist in the fabrication of reticles or features on a semiconductor substrate. The photoresist composition and the method are designed to reduce the variation in critical dimension of features across a surface of a substrate, where the variation in critical dimension is a result of localized resist loading. The photoresist composition is useful when the imaging system is G-line, H-line, or I-line, and the photoresist composition includes a sensitizer which works in combination with a DUV photoresist including a PAC, to sensitize the photoresist to the G-line, H-line and I-line imaging.

12 Claims, 3 Drawing Sheets

OTHER PUBLICATIONS

Kevin Kemp et al., "Effects of DUV Resist Sensitivities on Lithographic Process Window," SPIE, pp. 955-962, vol. 3049.

Uzodinma Okoroanyanwu et al., "Impact of Optical Absorption on Process Control for Sub-0.15-mm Device Patterning Using 193-nm Lithography," Proceedings of SPIE, pp. 781-790, vol. 3998.

Choi Pheng Soo et al., "Enhancement of Reduction of Catalytic Dissolution Reaction in Chemically Amplified Resists by Substrate Contaminants," IEEE Transactions on Semiconductor Manufacturing, Nov. 1999, pp. 462-469, vol. 12, No. 4.

Marco Zuniga et al., "Application of a General Reaction/Diffusion Resist Model to Emerging Materials with Extension to Non-Actinic Exposure," SPIE, pp. 256-267, vol. 3049.

Copy of Search Report in corresponding International Patent Appl. No. PCT/US03/16058.

* cited by examiner

SENSITIZED CHEMICALLY AMPLIFIED PHOTORESIST FOR USE IN PHOTOMASK FABRICATION AND SEMICONDUCTOR PROCESSING

BACKGROUND OF THE INVENTION

1. Field of the Invention

The present invention pertains to a photoresist composition useful in photomask fabrication and in semiconductor production. In particular, the photoresist composition enables the fabrication of photomasks which exhibit a combination of dense and isolated features. The same photoresist which is used for the photomask fabrication may also be applied to semiconductor and micro electro mechanical systems (MEMS) processing.

2. Brief Description of the Background Art

Photoresist compositions are used in microlithographic processes for making miniaturized electronic components, such as in the fabrication of semiconductor device structures; for making miniaturized mechanical systems; and for making microbiological structures. The miniaturized device structure patterns are typically created by transferring a pattern from a patterned masking layer overlying the semiconductor or other substrate rather than by direct write on the substrate, because of the time economy which can be achieved by blanket processing through a patterned masking layer. With regard to the micro device processing, the patterned masking layer may be a patterned photoresist layer or may be a patterned "hard" masking layer (typically an inorganic material or a high temperature organic material) which resides on the surface of the semiconductor device structure or other substrate to be patterned. The patterned masking layer is typically created using another mask which is frequently referred to as a photomask or reticle. A reticle is typically a thin layer of a metal-containing layer (such as a chrome-containing, molybdenum-containing, or tungsten-containing material, for example) deposited on a glass or quartz plate. The reticle is patterned to contain a "hard copy" of the individual device structure pattern to be recreated on the masking layer overlying a semiconductor structure or other substrate.

A reticle may be created by a number of different techniques, depending on the method of writing the pattern on the reticle. Due to the dimensional requirements of today's semiconductor structures, the writing method is generally with a laser or e-beam. A typical process for forming a reticle may include: providing a glass or quartz plate, depositing a chrome-containing layer on the glass or quartz surface, depositing an antireflective coating (ARC) over the chrome-containing layer, applying a photoresist layer over the ARC layer, direct writing on the photoresist layer to form a desired pattern, developing the pattern in the photoresist layer, etching the pattern into the chrome layer, and removing the residual photoresist layer. When the area of the photoresist layer contacted by the writing radiation becomes easier to remove during development, the photoresist is referred to as a positive-working photoresist. When the area of the photoresist layer contacted by the writing radiation becomes more difficult to remove during development, the photoresist is referred to as a negative-working photoresist. Advanced reticle manufacturing materials frequently include combinations of layers of materials selected from chromium, chromium oxide, chromium oxynitride, molybdenum, molybdenum silicide, and molybdenum tungsten silicide, for example.

As previously mentioned, the reticle or photomask is used to transfer a pattern to an underlying photoresist, where the reticle is exposed to blanket radiation which passes through open areas of the reticle onto the surface of the photoresist. The photoresist is then developed and the patterned photoresist is used to transfer the pattern to an underlying semiconductor structure, typically using a plasma dry etching process.

As the feature size requirements for a semiconductor substrate has become smaller, and as new applications for semiconductor devices and for MEMS devices are requiring the mixing of both logic and memory features on a single chip, new issues have arisen regarding both reticle fabrication and semiconductor chip production. While the memory devices tend to have features which are closely spaced (dense), the logic devices tend to have features which are sparsely spaced (isolated). As a result, proximity effects are observed during patterning of the photoresists used for fabrication of the reticle and during patterning of the photoresists used for pattern transfer to the semiconductor substrate.

For example, in the fabrication of a reticle patterned to have feature critical dimensions (CD) in the range of about 500 nm (0.50 µm) to about 2000 nm (2.0 µm), optical proximity effects have been observed during imaging of a standard novolak-based G-line, H-line, or I-line photoresist. In particular, for a standard I-line photoresist, such as an iP3600 photoresist available from Tokyo Ohka, Tokyo, Japan, or a PF188A photoresist available from Sumitomo, Osaka, Japan, CD errors from about 20 nm to about 40 nm, which are attributable to proximity effects have been observed in the patterned photoresist which was to be used to transfer the pattern to the reticle, and were observed in the chrome of the patterned reticle.

FIG. 1 shows a typical starting structure 100 used in the fabrication of a reticle. This starting structure was generally used in the preparation of test specimens during development of the present method of fabricating reticles. Starting structure 100 is a stack of layers which includes, from top to bottom, an approximately 5,000 Å thick layer 108 of a novolak-based photoresist, iX1100P (available from Clarient Corp. of Sommerville, N.J.); an approximately 500 Å thick layer 106 of an inorganic ARC, chrome oxynitride; an approximately 200 Å thick layer 104 of a mask material which is essentially chrome; and a silicon oxide-containing substrate 102.

In view of the sizable 20 nm to 40 nm CD error which was observed in the initial fabrication of reticle test specimens, a considerable amount of effort was spent examining all of the parameters of the continuous write laser tool to determine whether these parameters might be the cause of the CD errors. The details of that work will not be discussed here, since it was determined that the laser tool parameters were not responsible for the CD errors. It was discovered that the CD errors were generated as a result of the behavior of the photoresist material during imaging and development.

FIG. 2A shows a schematic top view 200 of the photoresist layer 108 shown in FIG. 1, where a first pattern, in particular a bar pattern 202 has been written on the upper surface 201 of photoresist layer 108. The distance $d_1$ between the bar lines 203 and 204 is about 2,000 nm (about 2.0 µm), and represents the CD which is to be controlled as tightly as possible. The thickness of each bar, 203 and 204 was about 2.0 µm. The distance $d_2$ represents the length of the bar pattern 202 and is about 5,700 µm.

FIG. 2B shows a schematic top view 220 of the photoresist layer 108 shown in FIG. 1, where a second pattern, in particular a steps pattern 222 has been written on the upper surface 221 of photoresist layer 108. The distance d, between each half of the step pattern 222 is about 2.0 µm and represents the CD. The distance $d_2$ is about 5,700 µm, with the length $d_3$ of each step being about 317 µm, with the exception of the top step 224, which is about 2×317 µm. The height (thickness) d4 of the end step 226 at each end of the steps pattern 222 is about 6.5 µm, with the height $d_5$ of the center step 224 being about 512 µm.

Since the photoresist is a positive photoresist, a cleared space is produced by exposing the photoresist to radiation and then developing the pattern created by the radiation to remove the photoresist in the irradiated area. With reference to FIG. 2A, bars 203 and 204 were irradiated by direct writing using a continuous wave laser having a half-intensity beam diameter (spotsize) of about 270 nm. With reference to FIG. 2B, each half of the steps pattern 222 was irradiated by direct writing using a the same continuous laser, where the laser was scanned over the surface 221 of photoresist 108 to produce the irradiated pattern. After writing of the pattern on the surface of starting structure, the pattern in photoresist layer 108 was developed and then transferred through underlying ARC layer 106 and chrome layer 104, to produce a chrome pattern (not shown) on the upper surface 103 of quartz substrate 102.

FIG. 3A shows the average CD for the distance $d_1$ of the a chrome line which was produced on the upper surface of the quartz substrate 108 (in accordance with FIG. 2A), as a function of the distance traveled in direction "X" as shown in FIG. 2A. The variation in CD ranged from about 1753 nm at X=0 µm to about 1746 nm at X=2700 µm, to about 1754 nm at X=5,400 µm. The difference in CD was only about 7–8 nm over the entire length of the chrome line.

FIG. 3B shows the average CD for the distance $d_4$ of a chrome line which was produced on the upper surface of quartz substrate 108 (in accordance with FIG. 2B), as a function of the distance traveled in direction "X" as shown in FIG. 2B. The variation in CD ranged from about 1780 nm at X=0 µm to about 1758 nm at X=2700 µm, to about 1782 nm at X=5,400 µm. The difference in CD was 23 nm over the length of the chrome line.

The difference in the CD range of the line obtained for the structures illustrated in FIGS. 2A and 2B is attributed to proximity effects which resulted from the difference in the size of the surface area of the photoresist 108 which was exposed to radiation adjacent to the line. These proximity effects are frequently referred to as photoresist loading effects.

Clearly, it would be highly desirable to be able to reduce the change in CD which is observed across a patterned reticle due to photoresist loading, as this would better enable the fabrication of a reticle where a portion of the features is dense, while another portion of the features is isolated.

SUMMARY OF THE INVENTION

The photoresist composition and method of using the photoresist in the fabrication of reticles is designed to reduce the variation in critical dimension of reticle features across a surface of a patterned reticle, where the variation in critical dimension is a result of localized resist loading.

In particular, we have developed a photoresist useful in the manufacture of reticles, where the photoresist is exposed to G-line, H-line, or I-line patterning radiation. The photoresist comprises a casting solvent, a modified phenol-substituted resin, a photochemical amplifying compound, and a sensitizer selected from the group consisting of anthracene or a derivative thereof, naphthalene or a derivative thereof, and mixtures of these materials. By way of example, and not by way of limitation, typically the sensitizer is selected from a group consisting of anthracene; 9-phenoxymethylanthracene; 1,4-dimethoxyanthracene; 9-anthracene methanol; 9,10-dimethyl anthracene; naphthalene; and 2-hydroxyl-1, 4-naphthaquinone. Frequently, the casting solvent is selected from materials such as propylene glycol monomethyl ether acetate (PMA, PGMEA), ethoxy ethyl propyionate, ethyl cellosolve acetate, diglyme and combinations thereof.

The base resin for the photoresist is selected from a modified phenolic resin, a modified novolak resin, and combinations thereof. One particularly advantageous base resin is a substituted polyhydroxy styrene or a copolymer thereof.

The photochemical amplifying compound (PAC) may be one of those known in the art, such as an onium salt metal halide complex, triflic acid and derivatives thereof, tosylate and various derivatives thereof, and mesylate and various derivatives thereof, for example and not by way of limitation. One of the frequently used PACs is an aryl sulfonium salt.

Use of the sensitizer described above permits efficient energy transfer from the photoactive compound (PAC) to the polymeric base material at the radiation wavelengths for G-line,≈436 nm; H-line,≈405 nm; and I-line,≈364 nm. This efficient energy transfer means that less power is required to image the resist and direct writing of a pattern on the resist can be carried out more rapidly, by a continuous writing laser (for example and not by way of limitation). Even more importantly, since the byproducts created during irradiation of (imaging of) the photoresist do not tend to inter react with the developing agent used to pattern the photoresist, there is a reduction in the optical proximity effects which tend to occur when both dense and isolated features are present on the same reticle. This enables a reduction in the change in CD over a reticle surface when both dense and isolated features are present. The sensitizer may be simply mixed into the combination of casting solvent such as PMA, modified phenol-substituted resin, and chemical amplifier, or the sensitizer may be attached to the phenol-substituted base resin or to the chemical amplifier.

The same concepts which apply to reticle fabrication also apply to the patterning of the photoresist described above on a semiconductor substrate. By the addition of the proper sensitizer, an I-line imaging system, for example can be used to generate a more controlled feature size, extending the ability of an I-line imaging system into smaller dimension features, for example, feature sizes down to about 0.3 µm. In the case of G-line and H-line imaging systems, the functionality of the imaging systems can be extended into smaller dimension features as well.

DETAILED DESCRIPTION OF EMBODIMENTS

Figure 1:
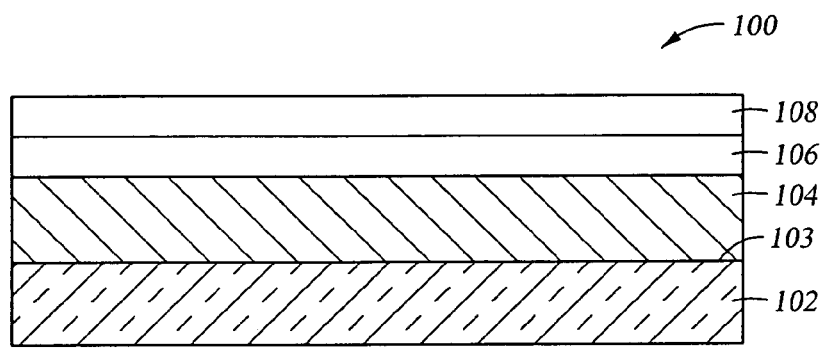
FIG. 1 shows a typical starting structure 100 used in the fabrication of a reticle.

As a preface to the detailed description, it should be noted that, as used in this specification and the appended claims, the singular forms "a", "an", and "the" include plural referents, unless the context clearly dictates otherwise.

Recent advances in the electronics industry have created a need to place memory and logic devices on the same chip. It happens that mixing of such devices leads to processing difficulties, since memory devices tend to make use of densely placed features, while logic devices frequently make use of isolated features. Processing of the photomasks (reticles) used to image photoresists which are used to transfer patterns to a semiconductor substrate is affected by proximity effects. Further, processing of the imaged photoresists themselves is affected by the same proximity effects. Manufacturers of the tools used to write patterns on a photoresist used to create the pattern on the reticle have very carefully investigated the variables which affect the writing tool, to reduce the variation in feature critical dimension (CD) across the reticle surface. In particular ETEC Systems of Hillsboro, Oreg. investigated their ALTA™ 3700 Tool which employs a continuous wave direct write laser to write a pattern on a photoresist which is used to transfer the pattern to the reticle. After considerable investigation, it was discovered that the problem was not the writing tool, but was instead a reaction which was going on between the developer used to develop the photoresist and byproduct compounds which were generated during writing of the pattern on the photoresist.

Since the photoresist used to pattern the reticle is basically the same photoresist as the one used on the surface of a semiconductor substrate to transfer a pattern to the substrate, one skilled in the art might wonder why this problem has not been observed with respect to semiconductor processing. The reason is that the features on the reticle are typically about four times larger than the features on the semiconductor substrate. In order to obtain semiconductor device features in the 180 nm to 250 nm range, the semiconductor processing industry has gone to deep ultraviolet radiation (DUV) 248 nm imaging of photoresists. However, reticle manufacturers are still able to use G-line (≈436 nm) or H-line (≈405 nm) or I-line (≈364 nm) radiation for imaging photoresists used to pattern a reticle.

ETEC Systems provides DUV imaging systems as well as I-line imaging systems, and applicants discovered that the problem of the developer reacting with the byproducts created during photoresist imaging is unique to the novolak-based resin systems which have been used in the combination with the G-line, H-line, and I-line imaging systems. Applicants did not observe the same development problem with respect to the photoresist system used in combination with DUV imaging systems. In particular, a chemically amplified DUV photoresist, DX1100 was not observed to exhibit the severe photoresist loading problems which had been observed with the novolak-based resin systems used for I-line patterning, for example. However, the DX1100 photoresist consists basically of a propylene glycol monomethyl ether acetate (PMA, PGMEA, or 1-methoxy-2-propyl acetate) casting solvent; a modified phenolic polymer; and an onium salt metal halide complex as a chemical amplifier. This photoresist does not perform at the radiation wavelength used to image an I-line photoresist.

Applicants have been able to add a sensitizer to the DX1100 DUV photoresist which enables this photoresist to perform when exposed to 364 nm radiation used to image an I-line photoresist. In particular, a sensitizer such as anthracene methanol, anthracene, or a diphenyl malaimide type compound has been added to the DUV photoresist. Applicants' new photoresist comprises the following solids: From about 75% by weight to about 85% by weight of the propylene glycol monomethyl ether acetate; about 20% by weight to about 30% by weight of modified phenolic resin, about 0.1% by weight to about 2% by weight of a photoactive agent such as an aryl sulfonium salt, and about 0.1% by weight to about 2% by weight of a sensitizer in the form of anthracene or naphthalene, or a derivative thereof. Such sensitizers include, by way of example and not by way of limitation: anthracene; 9-phenoxymethylanthracene; 1,4-dimethoxyanthracene; 9-anthracene methanol; 9,10-dimethyl anthracene; naphthalene; and 2-hydroxyl-1,4-naphthaquinone. The solids are typically dissolved in PGMEA Inventors or an equivalent solvent. In one preferred embodiment, the solids are 13.4% by weight propylene glycol monomethyl ether acetate, 2.6% by weight modified phenolic resin, about 2.0% by weight aryl sulfonium salt, and about 2.0% of a sensitizer selected from the compounds listed above. The sensitizer was simply mixed in with the DUV photoresist, and the mixture was filtered using a millipore filter prior to application by spin coating to the substrate surface. It is important to mention that the sensitizer could be associated with or bonded to the base polymer of the photoresist or associated with or bonded to the PAC of the photoresist. In particular, one skilled in the art could synthesize either a base polymer or a PAC with an anthracene or naphthalene or anthracene/naphthalene chromaphore attached.

The same procedures as those currently recommended by the DUV resist manufacturer may be used for application of the photoresist to the substrate. After application of the photoresist, the photoresist is post apply baked (PAB) at about 110° C. for a time period of ranging between about 7 minutes and about 15 minutes. After application of the photoresist and imaging of the photoresist using an ALTA™ 3700 imaging system, which employs a direct write continuous wave UV laser, the photoresist was developed using a spin/spray process with an AZ 300 MIF developer (available from AZ Clariant Corp. of Somerville, N.J.). This developer is a 2.38 wt % solution of tetramethyl ammonium hydroxide (TMAH). The development time was about 60 seconds. Concurrent with cessation of develop dispense, $CO_2$-sparged or $CO_2$-reionized water was dispensed for approximately 30 seconds at about 300 rpm for the first 15 seconds and at 1,500 rpm for the remaining 15 seconds.

Further rinse via spray-puddle was commenced, followed by a spin-dry step of approximately 90–120 seconds at 2,000–2,500 rpm.

The pattern in the photoresist was then transferred to the underlying photomask structure using a dry etch process. The substrate was etched in a high density plasma under conditions that reduced mean-to-target deviation, while still maintaining good CD uniformity. The plasma etch was performed in an inductively coupled plasma (ICP) etch tool using a three step process: descum/organic ARC (BARC) removal; chrome oxynitride (inorganic ARC)/chrome etch; and overetch.

Plasma etch systems such as the Applied Materials, Inc. TETRA® DPS™ etch system (available from Applied Materials, Inc., of Santa Clara, Calif.) may be used to provide excellent results. A plasma processing system which permits separate power application for plasma generation and for substrate biasing is commonly referred to as a Decoupled Plasma Source (DPS). Substrate biasing is used to attract ions and other high energy species from the plasma toward the substrate surface, enabling anisotropic etching. Separate application of power for plasma generation and power for substrate biasing permits separate control of the plasma density and the attractive forces (DC voltage) generated on the surface of the substrate.

The descum/ARC (BARC) removal step of the three step etch process removes any residual photoresist remaining on open areas after development, and removes the organic ARC (BARC) layer from the open areas. This is accomplished using an oxygen plasma. A DC bias is applied to the substrate during the descum/BARC removal step to accelerate oxygen ions from the plasma so that they impinge upon the reticle surface with high kinetic energy and directionality, normal to the reticle surface. This is accomplished using oxygen gas and by powering only the lower electrode (upon which the reticle plate rests), creating a capacitively coupled plasma with a high DC bias between the plasma and the reticle. Typically the process is carried out in a process chamber at a pressure of about 3 mTorr to about 8 mTorr. A plasma source gas of oxygen was fed into the processing chamber at a flow rate of about 17 sccm. RF power of about 125 W at a frequency of 13.56 MHZ was applied to the lower electrode (cathode). This provided a DC bias of about −340 to about −410 Volts on the photomask substrate surface, while providing an oxygen plasma over the reticle surface. The temperature of the reticle plate was in the range of 25° C., with a chamber wall temperature in the range of 40° C. The descum/organic ARC (BARC) removal time was about 30 seconds. The photoresist loss due to the descum/organic ARC (BARC) removal process is about 750 Å.

The chrome oxynitride (inorganic ARC)/chrome mask layer etch was done using a plasma generated from a chlorine-oxygen-helium gas mixture. The molecular ratio of the chlorine:oxygen:helium gas mixture was about 50:10:22. The total gas flow rate was about 82 sccm. The ICP coil was powered to about 60 W at 2 MHZ to generate a high density plasma. The lower electrode was powered to about 5 W at about 13.56 MHZ, to generate a DC voltage of about −50 V on the substrate. The temperature of the reticle plate was about 25° C., while the wall temperature of the process chamber was about 40° C. The etch end point was detected by optical reflectance, and occurred in about 200 seconds. Typically, higher oxygen concentrations and lower pressures cause higher mean-to-target deviation and lower selectivities, while favoring better CD uniformity. One skilled in the art can optimize the process for his/her particular apparatus.

Typically the chrome layer is overetched beyond endpoint to clear residual chrome from all open regions. Generally the overetch step is an extension of the chrome etch process described above. Longer overetch steps result in higher mean-to-target deviations. Chrome spot defect densities can be affected by the length of overetch, with lower defect densities for longer overetch processes.

After completion of the chrome layer etch, a strip and clean process is performed to remove any residual contaminants from the surface of the chrome layer. The strip chemical used was sulfuric peroxide which was heated to about 75° C. and applied over the surface of the substrate plate. After treatment with sulfuric peroxide, the substrate plate is rinsed with $CO_2$-reionized, or $CO_2$-sparged deionized water. After strip, the substrate plate was subjected to an acid clean using an industry standard 70:30 $H_2SO_4/H_2O_2$ solution, followed by another deionized water rinse. The strip step was performed on a Steag ASC 500 wet chemical processing station available from STEAG-HAMMATECH®, Santa Clara, Calif.

EXAMPLE ONE

Comparative Example

The description below is with respect to an I-line photoresist system, by example, and not by way of limitation.

Figure 2A:
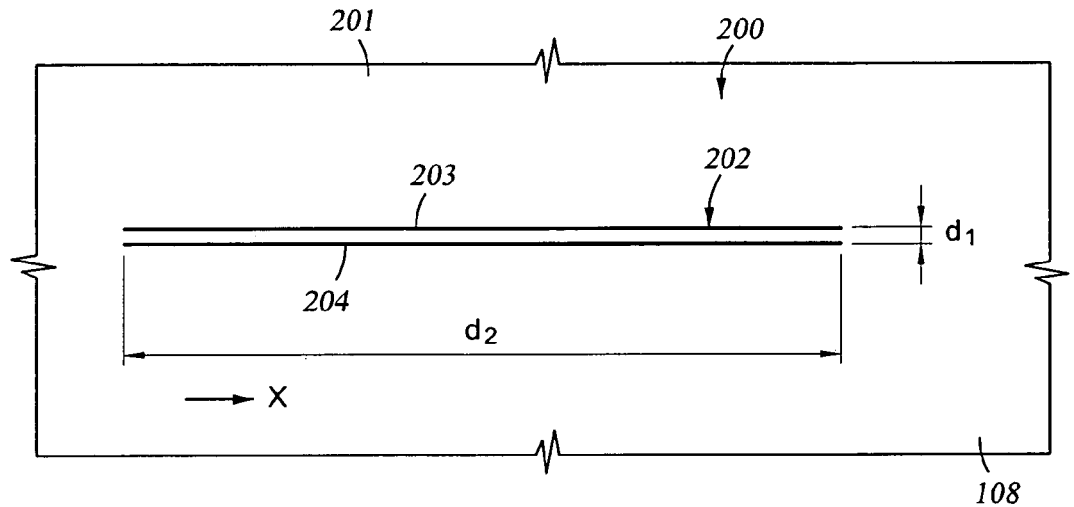
FIG. 2A shows a schematic top view 200 of the photoresist layer 108 shown in FIG. 1, where a first pattern, in particular a bar pattern 202 has been written on the upper surface 201 of photoresist layer 108.

As previously described, FIG. 2A shows a schematic top view 200 of the photoresist layer 108 shown in FIG. 1, where a first pattern, in particular a bar pattern 202 has been written on the upper surface 201 of photoresist layer 108. The distance $d_1$ between the bar lines 203 and 204 is about 2,000 nm (about 2.0 µm), and represents the CD which is to be controlled as tightly as possible. The thickness of each bar, 203 and 204 was about 2.0 µm. The distance $d_2$ represents the length of the bar pattern 202 and is about 5,700 µm.

Figure 2B:
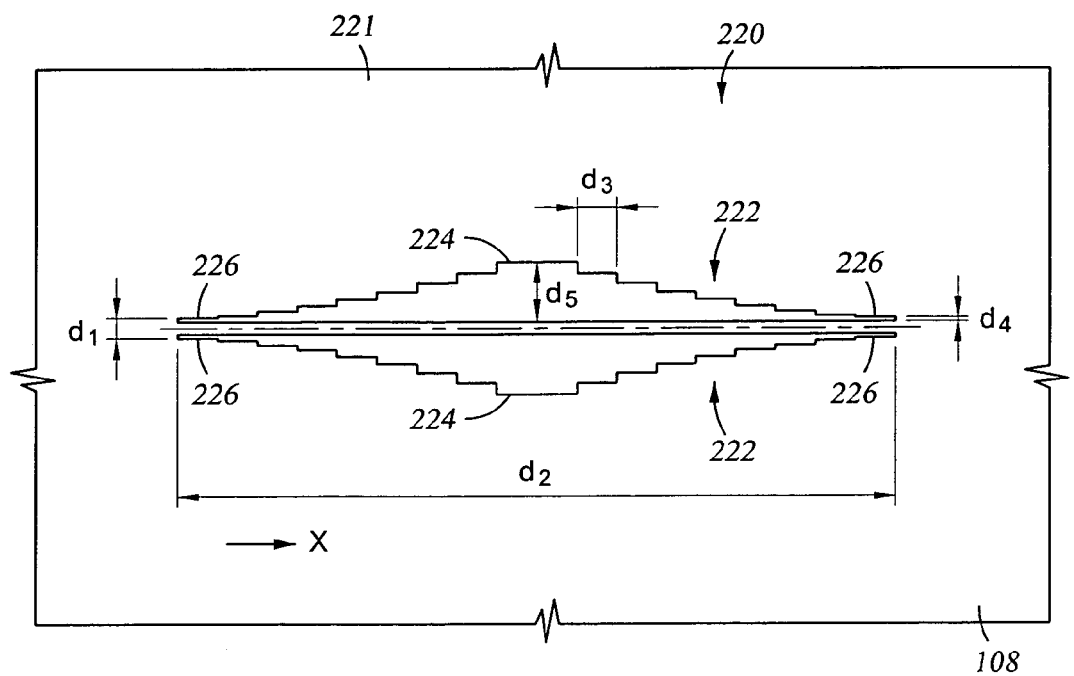
FIG. 2B shows a schematic top view 220 of the photoresist layer 108 shown in FIG. 1, where a second pattern, in particular a steps pattern 222 has been written on the upper surface 221 of photoresist layer 108.

FIG. 2B shows a schematic top view 220 of the photoresist layer 108 shown in FIG. 1, where a second pattern, in particular a steps pattern 222 has been written on the upper surface 221 of photoresist layer 108. The distance $d_1$ between each half of the step pattern 222 is about 2.0 µm and represents the CD. The distance $d_2$ is about 5,700 µm, with the length $d_3$ of each step being about 317 µm, with the exception of the top step 224, which is about 2×317 µm. The height (thickness) d4 of the end step 226 at each end of the steps pattern 222 is about 6.5 µm, with the height $d_5$ of the center step 224 being about 512 µm.

Since the photoresist is a positive photoresist, a cleared space is produced by exposing the photoresist to radiation and then developing the pattern created by the radiation to remove the photoresist in the irradiated area. With reference to FIG. 2A, bars 203 and 204 were irradiated by direct writing using a continuous wave laser having a half-intensity beam diameter (spotsize) of about 270 nm. With reference to FIG. 2B, each half of the steps pattern 222 was irradiated by direct writing using a the same continuous laser, where the laser was scanned over the surface 221 of photoresist 108 to produce the irradiated pattern. After writing of the pattern on the surface of starting structure, the pattern in photoresist layer 108 was developed and then transferred through underlying ARC layer 106 and chrome layer 104, to produce a chrome pattern (not shown) on the upper surface 103 of quartz substrate 102, in the manner described in detail above.

Figure 3A:
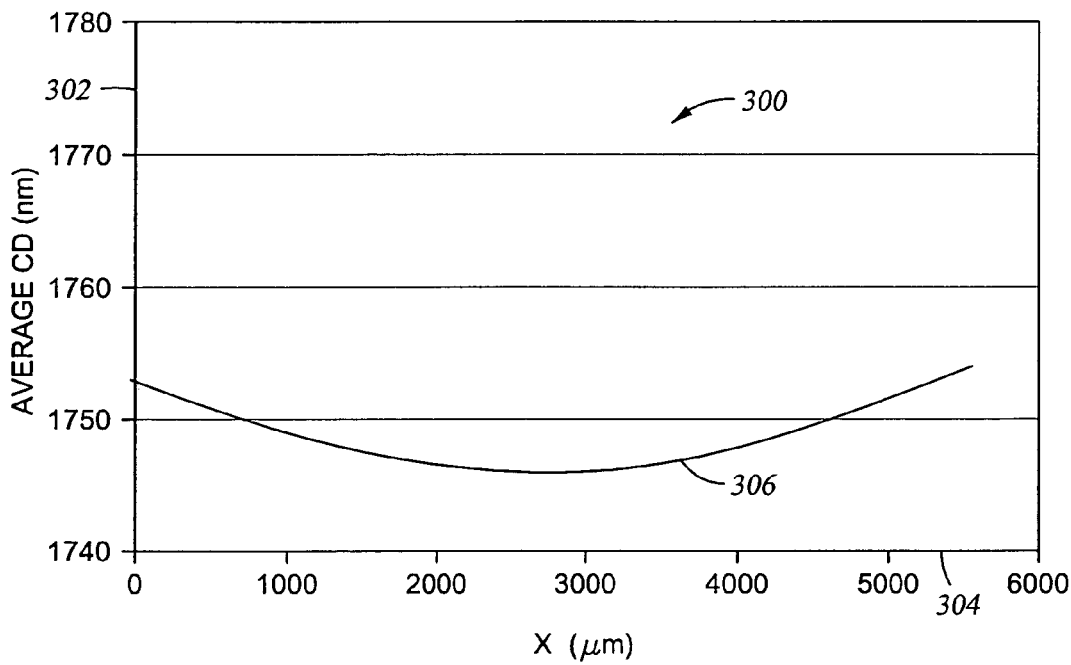
FIG. 3A shows the average CD for the distance $d_1$ of the a chrome line which was produced on the upper surface of the quartz substrate 108 (in accordance with FIG. 2A), as a function of the distance traveled in direction "X" as shown in FIG. 2A.

FIG. 3A shows a graph 300 which illustrates the average CD for the distance $d_1$ of the a chrome line which was produced on the upper surface of the quartz substrate 108 (in accordance with FIG. 2A), as a function of the distance traveled in direction "X" as shown in FIG. 2A. The average CD is shown on axis 302 of FIG. 3A, while the distance traveled in direction "X" is shown on axis 304. As illustrated by curve 306, the variation in CD ranged from about 1753 nm at X=0 μm to about 1746 μm at X=2700 μm, to about 1754 nm at X=5,400 μm. The difference in CD was only about 7–8 nm over the entire length of the chrome line.

Figure 3B:
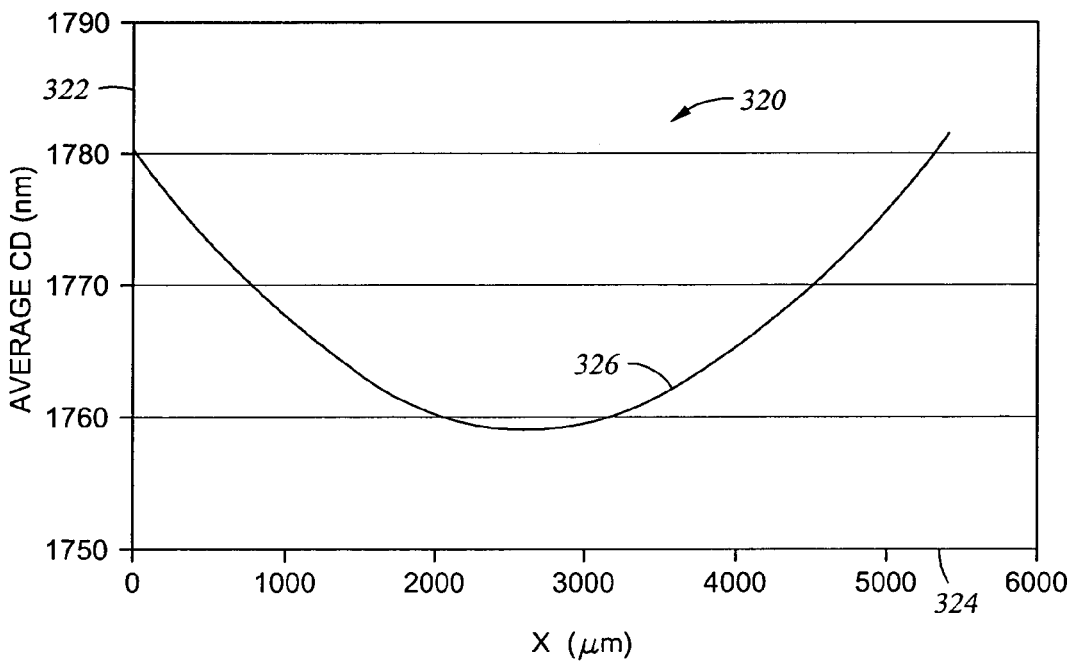
FIG. 3B shows the average CD for the distance $d_4$ of a chrome line which was produced on the upper surface of quartz substrate 108 (in accordance with FIG. 2B), as a function of the distance traveled in direction "X" as shown in FIG. 2B.

FIG. 3B shows a graph 320 which illustrates the average CD for the distance $d_4$ of a chrome line which was produced on the upper surface of quartz substrate 108 (in accordance with FIG. 2B), as a function of the distance traveled in direction "X" as shown in FIG. 2B. The average CD is shown on axis 322 of FIG. 3B, while the distance traveled in direction "X" is shown on axis 324. As illustrated by curve 326, the variation in CD ranged from about 1780 nm at X=0 μm to about 1758 nm at X=2700 μm, to about 1782 nm at X=5,400 μm. The difference in CD was 23 nm over the length of the chrome line. A series of similar Examples has shown differences in CD ranging from about 20 nm to about 40 nm.

EXAMPLE TWO

Figure 4:
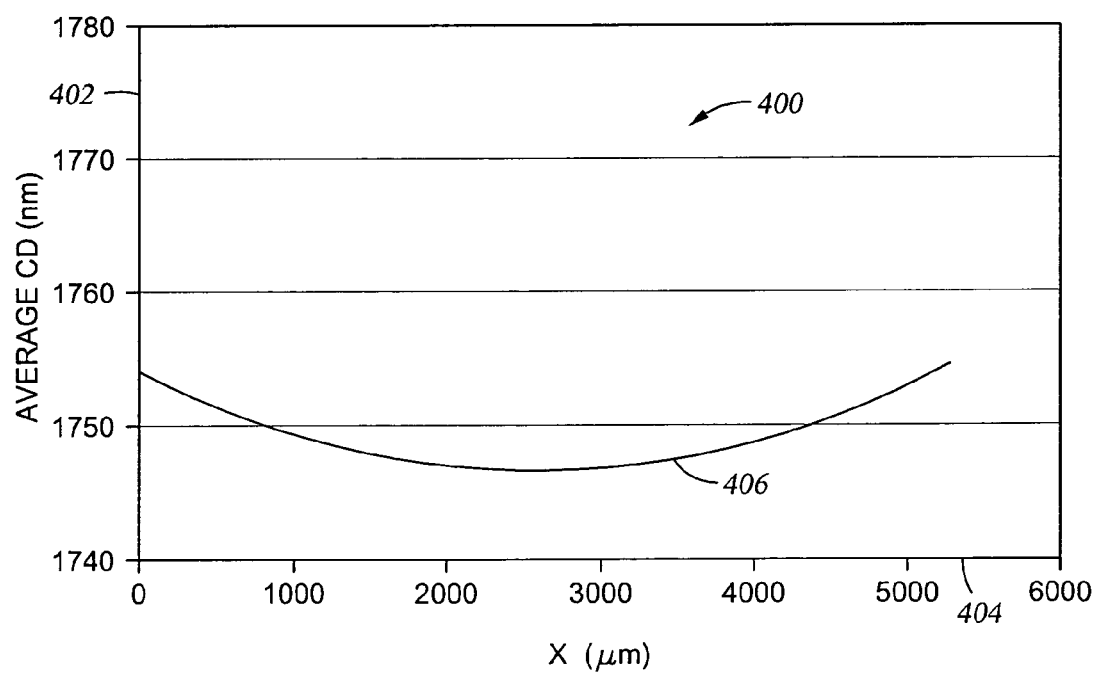
FIG. 4 shows the average CD for the distance $d_4$ of a chrome line which was produced on the upper surface of quartz substrate 108 (in accordance with FIG. 2B), as a function of the distance traveled in direction "X" as shown in FIG. 2B. However, with reference to FIG. 4, the photoresist of the present invention was used to form photoresist layer 108 rather than a diazoquinone sensitized, novolak-based photoresist of the kind described in the Background Art section of this disclosure.

FIG. 4 shows a graph 400 which illustrates the average CD of a chrome line which was produced on the upper surface of quartz substrate 108 (in accordance with FIG. 2B), as a function of the distance traveled in direction "X" as shown in FIG. 2B. However, the photoresist used to fabricate the test specimen was the DX1100 DUV photoresist with applicants' 9-anthracene methanol sensitizer added rather than the diazoquinone sensitized, novolak-based photoresist previously used for I-line imaging. In particular, FIG. 4 shows the average CD on axis 402, while the distance traveled in direction "X" is shown on axis 404. As illustrated by curve 406, the variation in CD ranged from about 1755 nm at X=0 μm to about 1746 nm at X=2700 μm, to about 1755 nm at X=5,400 μm. The difference in CD was about 9 nm over the length of the chrome line.

This variation in CD is very comparable with the variation in CD obtained when only the 2.0 μm thick bars 202 and 203 were used to define a line 202, as described with reference to FIG. 2A. This is a clear indication that when the photoresist of the present invention is used for I-line patterning, rather than a novolak-based photoresist, it is possible to avoid the photoresist loading effects which occur with the novolak-based photoresist. The photoresist of the present invention, imaged and developed in the manner described above, enables one skilled in the art to produce a reticle which contains both dense and isolated features with minimal CD error.

In addition, one skilled in the art reading this disclosure will be able to extend G-line, H-line, and I-line imaging systems for use in production of smaller features, by using the photoresist of the present invention rather than a diazoquinone, novolak-based photoresist for patterning semiconductor substrates.

The above described exemplary embodiments are not intended to limit the scope of the present invention, as one skilled in the art can, in view of the present disclosure expand such embodiments to correspond with the subject matter of the invention claimed below.

We claim:

1. A method of reducing optical proximity effects in a patterned photoresist which includes dense and isolated features, comprising: adding to a DUV photoresist a sensitizer which functions with said DUV photoersist to enable the use of imaging radiation having a wavelength ranging from about 364 nm to about 436 nm.

2. A method in accordance with claim 1, wherein said sensitizer is selected from the group consisting of: anthracene, naphthalene, a derivative of anthracene, a derivative of naphthalene, and combinations thereof.

3. A method in accordance with claim 1, wherein said sensitizer is selected from the group consisting of: anthracene; 9-phenoxymethylanthracene; 1,4-dimethoxyanthrecene; 9-anthracene methanol; 9, 10-dimethyl anthracene; naphthalene; and 2 hydroxyl-1, 4 napthaquinone.

4. A method in accordance with claim 1, wherein said sensitizer is associated with or attached to a base resin in said DUV photoresist, and comprises an anthracene chromaphore, a naphthalene chromaphore, or a combination thereof.

5. A method in accordance with claim 1, wherein said sensitizer is associated with or attached to a photochemical amplifying compound in said DUV photoresist, and comprises an anthracene chromaphore, a naphthalene chromaphore, or a combination thereof.

6. A method in accordance with claim 1 or claim 2 or claim 4 or claim 5 wherein said DUV photoresist comprises a substituted polyhydroxy styrene or a copolymer thereof.

7. A method in accordance with claim 1, wherein said photochemical amplifying compound is selected from the group consisting of an onium salt metal halide complex; triflic and derivatives thereof; tosylate and derivatives thereof; and mesylate and derivatives thereof.

8. A method in accordance with claim 7 wherein said DUV photoresist comprises a photochemical amplifying compound which is an onium salt metal halide complex.

9. A method in accordance with claim 8 wherein said onium salt metal halide complex is an aryl sulfonium salt.

10. A method in accordance with claim 1, or claim 2 or claim 4 or claim 5 wherein said patterned photoresist is used to fabricate a reticle.

11. A method in accordance with claim 1 or claim 2, or claim 4 or claim 5, wherein said patterned photoresist is used to fabricate a feature on a semiconductor substrate.

12. A method in accordance with in accordance with claim 1 or claim 2, or claim 4 or claim 5 wherein said patterned photoresist is used to fabricate a MEMS feature on a substrate.

* * * * *